(12) United States Patent
Hoshiyama et al.

(10) Patent No.: US 11,650,281 B2
(45) Date of Patent: May 16, 2023

(54) EXCITATION REGION SETTING METHOD AND MAGNETIC RESONANCE IMAGING APPARATUS

(71) Applicant: CANON MEDICAL SYSTEMS CORPORATION, Otawara (JP)

(72) Inventors: Yutaka Hoshiyama, Nasushiobara (JP); Mitsuhiro Bekku, Utsunomiya (JP); Kensuke Shinoda, Otawara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 247 days.

(21) Appl. No.: 16/986,381

(22) Filed: Aug. 6, 2020

(65) Prior Publication Data
US 2021/0055365 A1    Feb. 25, 2021

(30) Foreign Application Priority Data

Aug. 20, 2019   (JP) .............................. JP2019-150371

(51) Int. Cl.
  *G01R 33/565*    (2006.01)
  *G01R 33/483*    (2006.01)
  *G01R 33/54*     (2006.01)

(52) U.S. Cl.
  CPC ... *G01R 33/56572* (2013.01); *G01R 33/4833* (2013.01); *G01R 33/4838* (2013.01); *G01R 33/546* (2013.01); *G01R 33/56563* (2013.01)

(58) Field of Classification Search
  CPC .......... G01R 33/56572; G01R 33/4833; G01R 33/4838; G01R 33/546; G01R 33/56563; G01R 33/4835
  See application file for complete search history.

(56) References Cited

U.S. PATENT DOCUMENTS

| | | | |
|---|---|---|---|
| 7,227,357 B2 | 6/2007 | Werthner | |
| 2004/0160221 A1* | 8/2004 | Kiefer | G01R 33/56518 324/309 |

(Continued)

FOREIGN PATENT DOCUMENTS

| | | |
|---|---|---|
| JP | 2010-419740 A | 6/2010 |
| JP | 2014-050530 A | 3/2014 |

(Continued)

OTHER PUBLICATIONS

U.S. Appl. No. 16/569,316, filed Sep. 12, 2019, 2020/0103482 A1, Shinoda, K, et al.

(Continued)

*Primary Examiner* — Rishi R Patel
(74) *Attorney, Agent, or Firm* — Oblon, McClelland, Maier & Neustadt, L.L.P.

(57) ABSTRACT

An excitation region setting method according to an embodiment includes: receiving a designation of a first region from a user, the first region being designated in a distortion-corrected image that is a magnetic resonance image in which an effect of a distortion of a magnetic field has been corrected; calculating an actual excitation region where a subject is to be excited, based on the designated first region and the effect of the distortion of the magnetic field; and correcting imaging conditions including at least one of an orientation of a slice plane that defines the actual excitation region, or a frequency of a high-frequency magnetic field applied to the subject, in such a manner that the calculated actual excitation region becomes closer to an ideal excitation region represented as the first region.

12 Claims, 10 Drawing Sheets

(56) References Cited

U.S. PATENT DOCUMENTS

| | | | | |
|---|---|---|---|---|
| 2006/0012365 A1* | 1/2006 | Werthner | ......... | G01R 33/56563 |
| | | | | 324/307 |
| 2013/0230223 A1* | 9/2013 | Jellus | ....................... | A61B 5/00 |
| | | | | 324/309 |
| 2013/0265049 A1* | 10/2013 | Fautz | ................... | G01R 33/543 |
| | | | | 324/309 |
| 2017/0261586 A1* | 9/2017 | Carinci | .............. | G01R 33/3628 |
| 2020/0103482 A1 | 4/2020 | Shinoda et al. | | |
| 2021/0373100 A1* | 12/2021 | Zhang | .................. | G01R 33/583 |

FOREIGN PATENT DOCUMENTS

| | | |
|---|---|---|
| JP | 2019-013706 A | 1/2019 |
| JP | 2020-43909 A | 3/2020 |

OTHER PUBLICATIONS

Notice of Reasons for Refusal dated Feb. 21, 2023, in Japanese Patent Application No. 2019-150371 filed Aug. 20, 2019, 2 pages.

\* cited by examiner

FIG.4
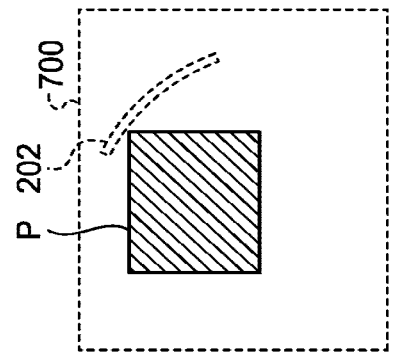
EXPLANATORY IMAGE OF ACTUAL EXCITATION SLICE PLANE
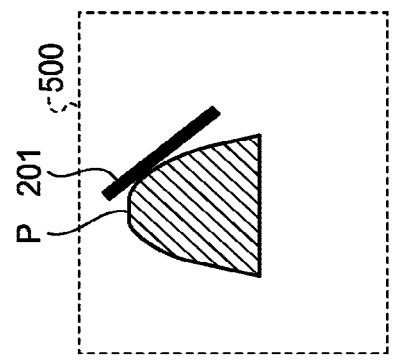
EXPLANATORY IMAGE OF SLICE POSITION IN UNCORRECTED MAGNETIC RESONANCE IMAGE
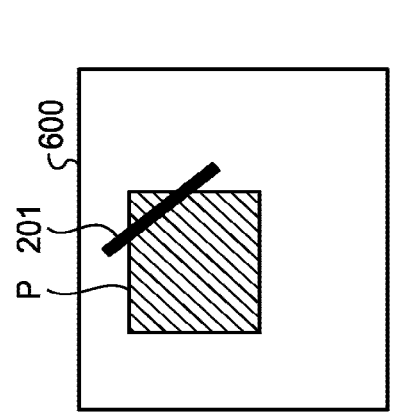
SLICE POSITION IN DISTORTION-CORRECTED IMAGE

EXCITATION REGION SETTING METHOD AND MAGNETIC RESONANCE IMAGING APPARATUS

CROSS-REFERENCE TO RELATED APPLICATIONS

This application is based upon and claims the benefit of priority from Japanese Patent Application No. 2019-150371, filed on Aug. 20, 2019; the entire contents of which are incorporated herein by reference.

FIELD

Embodiments described herein relate generally to an excitation region setting method and a magnetic resonance imaging apparatus.

BACKGROUND

In a magnetic resonance imaging apparatus, in a region distant from the center of the magnetic field, linearity of the gradient magnetic field deteriorates. Such non-linearity of the gradient magnetic field causes a distortion in the peripheral region of a magnetic resonance image captured by the magnetic resonance imaging apparatus. Therefore, a physician or the like making a diagnosis uses a distortion-corrected image resultant of correcting the distortion caused by the non-linearity of the gradient magnetic field.

Furthermore, because such a distortion correction is applied, when the distortion-corrected image is used as a positioning image for defining a slice position, for example, the slice position designated by an operator becomes different from the position that is to be actually excited. Therefore, for example, for a region distant from the center of the magnetic field, available is a technology for moving the slice position designated by the operator in the distortion-corrected image, in a parallel direction, and capturing an image of the cross section at the resultant position.

However, there have been cases in which a ratio of match between the region set by the operator in the distortion-corrected image, and the actual excitation region becomes low.

BRIEF DESCRIPTION OF THE DRAWINGS

FIG. 4 is a schematic for explaining the difference between an ideal slice plane and an excitation slice plane according to the embodiment;

DETAILED DESCRIPTION

An excitation region setting method, and a magnetic resonance imaging apparatus according to an embodiment will now be explained in detail with reference to some drawings.

Embodiment

An excitation region setting method according to the embodiment comprising:

receiving a designation of a first region from a user, the first region being designated in a distortion-corrected image that is a magnetic resonance image in which an effect of a distortion of a magnetic field has been corrected;

calculating an actual excitation region where a subject is to be excited, based on the designated first region and the effect of the distortion of the magnetic field; and correcting imaging conditions including at least one of an orientation of a slice plane that defines the actual excitation region, or a frequency of a high-frequency magnetic field applied to the subject, in such a manner that the calculated actual excitation region becomes closer to an ideal excitation region represented as the first region.

Figure 1:
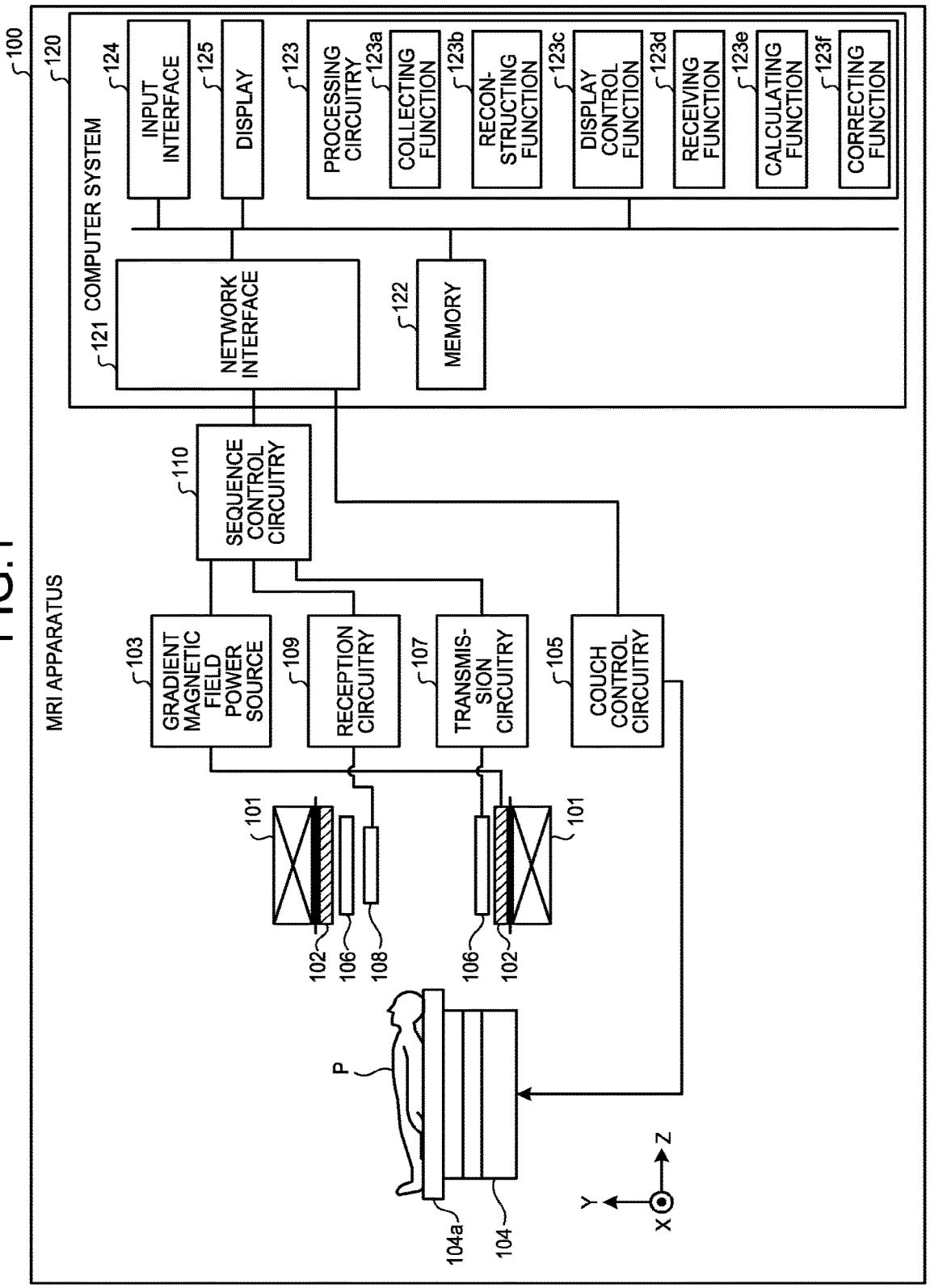
FIG. 1 is a block diagram illustrating one example of a configuration of a magnetic resonance imaging apparatus according to an embodiment.

FIG. 1 is a block diagram illustrating one example of a configuration of a magnetic resonance imaging (MRI) apparatus 100 according to the embodiment. As illustrated in FIG. 1, the MRI apparatus 100 includes a static magnetic field magnet 101, a gradient coil 102, a gradient magnetic field power source 103, a couch 104, couch control circuitry 105, a transmission coil 106, transmission circuitry 107, a reception coil 108, reception circuitry 109, and sequence control circuitry 110, and a computer system 120. A subject P (such as a human body) is not included in the MRI apparatus 100.

The X axis, the Y axis, and the Z axis illustrated in FIG. 1 make up an apparatus coordinate system that is unique to the MRI apparatus 100. For example, the Z-axis direction is matched with the axial direction of the cylindrical gradient coil 102, and is set in a manner extending along the magnetic flux of the static magnetic field generated by the static magnetic field magnet 101. The Z-axis direction extends in the same direction as the longitudinal direction of a couch-top 104a to be described later, and as the body axis direction of the subject P. The X-axis direction is set in a manner extending along the horizontal direction perpendicularly intersecting with the Z axis direction. The Y-axis direction is set in a manner extending along the vertical direction perpendicularly intersecting with the Z axis direction.

The static magnetic field magnet 101 is a magnet having a hollowed cylindrical shape (including a shape having an ecliptic cross section on the plane perpendicularly intersecting with the axis of the cylinder), and generates a uniform static magnetic field in the internal space thereof.

The gradient coil 102 is a coil having a hollowed cylindrical shape (including a shape having an ecliptic cross section on the plane perpendicularly intersecting with the axis of the cylinder), and generates a gradient magnetic field. To explain more in detail, the gradient coil 102 receives independent power supply from the gradient magnetic field power source 103, which will be described later, and generates a gradient magnetic field in the internal space of the cylinder, along each of the X axis, the Y axis, and the Z axis that are perpendicularly intersecting with one another.

The gradient magnetic fields in the X axis, the Y axis, and the Z axis, generated by the gradient coil 102 correspond to, for example, a slice selection gradient magnetic field, a phase-encoding gradient magnetic field, and a read-out gradient magnetic field, respectively. The slice selection gradient magnetic field is used in defining an imaged cross section. The phase-encoding gradient magnetic field is used in changing the phase of a magnetic resonance signal correspondingly to a spatial position. The read-out gradient magnetic field is used in changing the frequency of the magnetic resonance signal correspondingly to a spatial position.

It is ideal if the gradient magnetic field is linearly distributed about the center of the magnetic field, but generally speaking, the linearity of the gradient magnetic field deteriorates, and becomes distorted, in a region distant from the center of the magnetic field. In this embodiment, a region distant from the center of the gradient magnetic field is referred to as an off-center region.

The gradient magnetic field power source 103 supplies a current to the gradient coil 102. The gradient magnetic field power source 103 causes the gradient coil 102 to apply the gradient magnetic field, under the control of the sequence control circuitry 110, which will be described later.

The couch 104 is provided with the couchtop 104a on which the subject P is laid, and inserts the couchtop 104a having the subject P laid thereon into an imaging port, under the control of the couch control circuitry 105. The couch control circuitry 105 is a processor that moves the couchtop 104a in the longitudinal and the up-and-down directions, by driving the couch 104 under the control of the computer system 120.

The transmission circuitry 107 supplies a radio frequency (RF) pulse corresponding to the Larmor frequency, which is determined by the type of a target atomic nucleus and the strength of the magnetic field, to the transmission coil 106.

The transmission coil 106 excites a region of the subject P, by applying a high-frequency magnetic field. Specifically, the transmission coil 106 is disposed on the inner side of the gradient coil 102, generates a high-frequency magnetic field by receiving the supply of the RF pulse from the transmission circuitry 107, and applies the high-frequency magnetic field to the subject P.

The reception coil 108 is disposed on the inner side of the gradient coil 102, and receives a magnetic resonance signal (hereinafter, referred to as an MR signal) emitted from the subject P, as a result of being affected by the high-frequency magnetic field. When the MR signal is received, the reception coil 108 outputs the received MR signal to the reception circuitry 109.

In FIG. 1, the reception coil 108 is configured separately from the transmission coil 106, but this configuration is merely one example, and the configuration is not limited thereto. For example, it is also possible to use a configuration in which the reception coil 108 is also used as the transmission coil 106. Furthermore, the reception coil 108 is not limited to a reception coil for the entire body, provided to the gantry, but may also be a local coil corresponding to a target region for which an image is to be captured. Types of the local coil include, for example, a spine coil for capturing an image of the spine, and a head coil for capturing an image of the head. If there are a plurality of target regions for which an image is to be captured, it is also possible to install a plurality of local coils as the reception coil 108.

The reception circuitry 109 generates MR data by performing an analog-to-digital (A/D) conversion to the analog MR signal output from the reception coil 108. The reception circuitry 109 also transmits the generated MR data to the sequence control circuitry 110. The A/D conversion may also be performed in the reception coil 108, and the reception circuitry 109 may also perform any signal processes other than the A/D conversion. In this embodiment, the MR signal before the A/D conversion, as well as the MR data after the A/D conversion, may be referred to as an MR signal.

The sequence control circuitry 110 controls the gradient magnetic field power source 103, the transmission circuitry 107, and the reception circuitry 109, so as to capture an image of the subject P, based on sequence information received from the computer system 120. The sequence control circuitry 110 may be implemented as a processor, or as a combination of software and hardware.

The sequence information is information that defines a pulse sequence executed by the MRI apparatus 100 in a medical examination. Defined in the sequence information is information such as the strength of the current supplied to the gradient coil 102 from the gradient magnetic field power source 103, the timing for supplying the current, the intensity of the RF pulse transmitted to the transmission coil 106 from the transmission circuitry 107, the timing for applying the RF pulse, and the timing for causing the reception circuitry 109 to detect the MR signal, for example.

The sequence information is generated by the computer system 120 based on a large number of pieces of imaging parameter information, including imaging conditions designated by the operator, such as a selected position to be excited, repetition time (TR), echo time (TE), the number of slices, a slice thickness, and a field of view (FOV). The imaging conditions according to the embodiment also include, for example, at least one of the position of the slice plane that defines the actual excitation region, the orientation of the slice plane, or the frequency of the high-frequency magnetic field that is to be applied to the subject P. More particularly, the imaging conditions include, for example, at least one of the orientation of the slice plane or the frequency of the high-frequency magnetic field that is to be applied to the subject P. For example, the imaging conditions may include both the orientation of the slice plane and the frequency of the high-frequency magnetic field, and the imaging conditions may include either the orientation of the slice plane or the frequency of the high-frequency magnetic field. Moreover, the imaging conditions may include any other content in addition to these examples. More specifically, the frequency of the high-frequency magnetic field included in the imaging conditions is specified as a frequency range of the high-frequency magnetic field. The frequency range of the high-frequency magnetic field will be described later.

The computer system 120 performs operations such as controlling the entire MRI apparatus 100, collecting data, and reconstructing images. To explain more in detail, the computer system 120 controls the sequence control circuitry 110 and the couch control circuitry 105. The computer system 120 includes network (NW) interface 121, memory 122, processing circuitry 123, an input interface 124, and a display 125.

The NW interface 121 transmits the sequence information to the sequence control circuitry 110, and receives the MR data from the sequence control circuitry 110.

The memory 122 stores therein various computer programs. The memory 122 stores therein the MR data received by the NW interface 121, time sequence data plotted to the k space, being plotted by a collection function 123a, which will be described later, a distortion-corrected image generated by a reconstructing function 123b, which also will be described later, gradient magnetic field distortion information, and magnetic field strength distribution information.

The gradient magnetic field distortion information is information representing values of the distortion in the gradient magnetic field in the MRI apparatus 100. More specifically, the gradient magnetic field distortion information indicates a ratio at which the gradient magnetic field becomes distorted from the ideal linearity, with respect to the distance from the center of the magnetic field, for example. The gradient magnetic field distortion information is registered in the memory 122, as a value unique to the MRI apparatus 100, for example. The distortion of the gradient magnetic field in the MRI apparatus 100 may be a result achieved by measuring the gradient magnetic field, by executing a scan after the MRI apparatus 100 is installed, or may be theoretical values calculated by a simulation or the like. The method for calculating of the distortion of the gradient magnetic field is not limited to any particular method.

The magnetic field strength distribution information is information representing a distribution of the strength of the magnetic field, the magnetic field being generated as a result of superimposing the gradient magnetic field onto the static magnetic field. In other words, the magnetic field strength distribution information is information representing a field map. The magnetic field strength distribution information is generated based on the gradient magnetic field distortion information described above, and information representing the strength distribution of the static magnetic field, for example. The strength distribution of the static magnetic field may be actual measurements, or theoretical values calculated by a simulation or the like. Furthermore, because the space of a magnetic field is three dimensional, the magnetic field strength is defined for each coordinate point of the three-dimensional space defined by the X axis, the Y axis, and the Z axis, in the magnetic field strength distribution. The three-dimensional coordinates of the magnetic field space are defined with reference to the center of the gradient magnetic field, for example. The magnetic field strength distribution information may be generated and registered in the memory 122 in advance, or may be generated when a process of a calculating function 123e or a correcting function 123f, which will be described later, is to be performed.

The memory 122 also stores therein various computer programs. The memory 122 is implemented as a random access memory (RAM), a semiconductor memory such as a flash memory, a hard-disk drive, or an optical disc, for example. The memory 122 is used as a non-transitory memory medium by hardware.

The input interface 124 receives inputs of various instructions or information from an operator, such as a physician or a medical radiologist. The input interface 124 is implemented as a trackball, a switch button, a mouse, or a keyboard, for example. The input interface 124 is connected to the processing circuitry 123, and converts the input operation received from the operator into an electric signal, and output the electric signal to the processing circuitry 123.

The display 125 displays various graphical user interfaces (GUIs), magnetic resonance (MR) images, and the like, under the control of the processing circuitry 123.

The processing circuitry 123 controls the entire MRI apparatus 100. To explain more in detail, the processing circuitry 123 includes a collecting function 123a, a reconstructing function 123b, a display control function 123c, a receiving function 123d, a calculating function 123e, and a correcting function 123f. The collecting function 123a is one example of a collecting unit. The process performed by the collecting function 123a is referred to as a collecting step. The collecting function 123a may be divided into an applying function and a collecting function. It is also possible to divide the process performed by the collecting function 123a into two steps of an applying step and a collecting step. The reconstructing function 123b is one example of a reconstructing unit. The process performed by the reconstructing function 123b is referred to as a reconstructing step. The display control function 123c is one example of a display control unit. The process performed by the display control function 123c is referred to as a displaying step. The receiving function 123d is one example of a receiving unit. The process performed by the receiving function 123d is referred to as a receiving step. The calculating function 123e is one example of a calculating unit. The process performed by the calculating function 123e is referred to as a calculating step. The correcting function 123f is one example of a correcting unit. The process performed by the correcting function 123f is referred to as a correcting step.

The processing functions including the collecting function 123a, the reconstructing function 123b, the display control function 123c, the receiving function 123d, the calculating function 123e, and the correcting function 123f that are the elements included in the processing circuitry 123 are stored in the memory 122, as computer-executable programs, for example. The processing circuitry 123 implements the functions corresponding to the computer programs, by reading the computer programs from the memory 122, and executing the computer programs. In other words, the processing circuitry 123 having read the computer programs comes to have the functions illustrated in the processing circuitry 123 in FIG. 1. Furthermore, although explained with reference to FIG. 1 is an example in which the processing functions of the collecting function 123a, the reconstructing function 123b, the display control function 123c, the receiving function 123d, the calculating function 123e, and the correction function 123f are implemented by a single piece of processing circuitry 123; but it is also possible to configure the processing circuitry 123 as a combination of a plurality of independent processors, and these processing functions may be implemented by causing the processors to execute the respective computer programs.

The term "processor" used in the explanation above means circuitry such as a central processing unit (CPU), a graphics processing unit (GPU) an application-specific integrated circuit (ASIC), or a programmable logic device (such as a simple programmable logic device (SPLD), a complex programmable logic device (CPLD), and a field-programmable gate array (FPGA)). Instead of storing the computer programs in the memory 122, the computer programs may also be incorporated into the processor circuitry directly. In such a configuration, the processor implements these functions by reading the computer programs incorporated in the circuitry and executing the computer programs.

The collecting function 123a collects MR data resultant of converting MR signals generated by executing various pulse sequences, from the sequence control circuitry 110 via the NW interface 121. The collecting function 123a according to the embodiment also applies a high-frequency magnetic field at the RF frequency corrected by the correcting function 123f, which will be described later, to an excitation slice plane corrected by the correcting function 123f.

Specifically, the collecting function 123a determines sequence information based on a normal vector corrected by the correcting function 123f, which will be described later. The collecting function 123a then applies, by executing the pulse sequence, a gradient magnetic field that is based on the normal vector corrected by the correcting function 123f, and a high-frequency magnetic field at the RF frequency corrected by the correcting function 123f, to the corrected excitation slice plane. The corrected excitation slice plane is one example of an imaging region for which a magnetic resonance image is to be captured. The collecting function 123a then collects MR data that is based on the MR signals emitted from the subject P, being emitted as a result of the application of the high-frequency magnetic field to the corrected excitation slice plane.

The collecting function 123a also plots the collected MR data in the temporal order, based on the amount of phase encoding and the amount of frequency encoding, achieved by the gradient magnetic field. The MR data plotted in the k space is referred to as k-space data. The k-space data is stored in the memory 122.

The reconstructing function 123b generates a magnetic resonance image based on the k-space data stored in the memory 122. For example, the reconstructing function 123b generates a distortion-corrected image by applying a reconstructing process such as Fourier transform to the k-space data, and by correcting the effect of the distortion of the gradient magnetic field. The distortion-corrected image is a magnetic resonance image resultant of correcting the effect of the distortion of the magnetic field. In this embodiment, the distortion in the magnetic field means a distortion in the gradient magnetic field.

For example, the reconstructing function 123b generates a distortion-corrected image by applying a gradient distortion correction (GDC) to the result of a process such as Fourier transform applied to the k-space data, based on the gradient magnetic field distortion information stored in the memory 122. The distortion-corrected image is also referred to as a GDC image.

Figure 2:
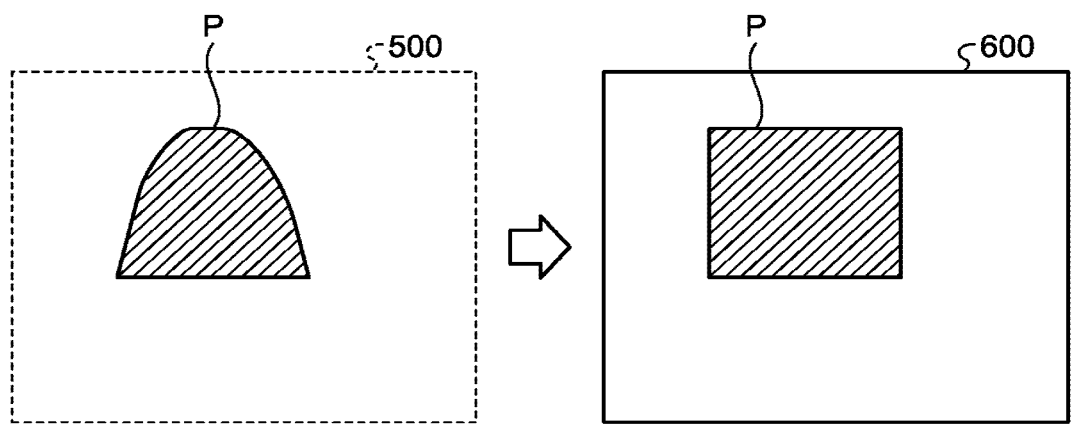
FIG. 2 is a schematic illustrating one example of a distortion-corrected image according to the embodiment.

FIG. 2 is a schematic illustrating one example of a distortion-corrected image 600 according to the embodiment. In FIG. 2, an image without the correction of the effect of the distortion of the magnetic field is illustrated as an uncorrected magnetic resonance image 500, so as to enable a comparison with the distortion-corrected image 600. In FIG. 2, the cross-sectional shape of the subject P is illustrated as a rectangle so that the distortion of the uncorrected magnetic resonance image 500 can be easily understood.

The peripheral region of the uncorrected magnetic resonance image 500 illustrated in FIG. 2 corresponds to the region distant from the center of the gradient magnetic field, that is, an off-center region. As illustrated in FIG. 2, in the off-center region of the uncorrected magnetic resonance image 500, the shape of the subject P is rendered as distorted, due to the deterioration in the linearity of the gradient magnetic field. Therefore, although the actual cross-sectional shape of the subject P is rectangular, the shape may become rendered as a rounded trapezoid shape, for example, in the uncorrected magnetic resonance image 500. The way in which the distortion appears in the uncorrected magnetic resonance image 500, as a result of the effect of the distortion in the gradient magnetic field, as illustrated in FIG. 2, is merely one example, and the distortion is not limited thereto.

By causing the reconstructing function 123b to correct the distortion resultant of the distortion of the gradient magnetic field in the uncorrected magnetic resonance image 500, based on the gradient magnetic field distortion information stored in the memory 122, for example, the distortion in the cross-sectional shape of the subject P is alleviated in the distortion-corrected image 600. The reconstructing function 123b then stores the generated distortion-corrected image 600 in the memory 122.

In FIG. 2, the uncorrected magnetic resonance image 500 is included for the purpose of comparison, but in this embodiment, the reconstructing function 123b generates the distortion-corrected image 600 directly, without generating the uncorrected magnetic resonance image 500.

Referring back to FIG. 1, the display control function 123c displays the distortion-corrected image 600 on the display 125. The display control function 123c also displays GUIs for receiving various instructions and input operations of various types of information from the operator, on the display 125.

For example, the display control function 123c displays the distortion-corrected image 600, as a positioning image for the next image-capturing operation, on the display 125. The positioning image is also referred to as a locator image or a scout image. The display control function 123c displays an operation screen allowing the operator to designate the slice position for the next image-capturing operation in the positioning image. The display control function 123c may also display the distortion-corrected image 600, as an image for allowing a physician or the like to make a diagnosis.

The receiving function 123d receives a designation of a first region in the distortion-corrected image 600, from the operator (user). The first region represents an ideal excitation region. To explain more in detail, the receiving function 123d receives a slice plane position (hereinafter, referred to as a slice position) designated in the distortion-corrected image 600 by the operator as the first region. Hereinafter, the slice position designated by the operator will be referred to as an ideal slice position. The slice plane is sometimes simply referred to as a slice, an imaged cross section, or a cross section.

Furthermore, the imaged cross section resultant of capturing an image of the subject P at the ideal slice position, that is, the slice plane in the distortion-corrected image 600, will be referred to as an ideal slice plane. In other words, the ideal excitation region corresponds to the ideal slice plane which the operator wants to capture an image of.

Figure 3:
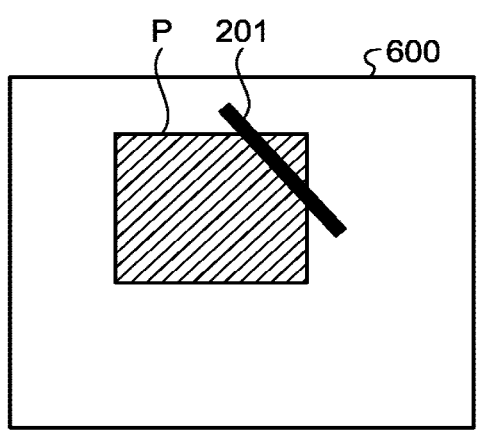
FIG. 3 is a schematic illustrating one example of a positioning image according to the embodiment.

FIG. 3 is a schematic illustrating one example of the positioning image according to the embodiment. In this embodiment, the distortion-corrected image 600 will be used as the positioning image. A slice reference shape 201 illustrated in FIG. 3 indicates the ideal slice position in the distortion-corrected image 600, which is being displayed as the positioning image.

The operator designates the ideal slice position by operating the position and the inclination of the slice reference shape 201 in the distortion-corrected image 600, which is being displayed as the positioning image. In FIG. 3, the ideal slice position is illustrated two dimensionally, but in reality, because a slice plane has a depth, the ideal slice plane is defined three dimensionally. The position of the ideal slice plane is defined by excitation slice positions in the X axis, the Y axis, and the Z axis, respectively, for example. Furthermore, the orientation of the ideal slice plane is defined as the orientation of the normal vector perpendicularly intersecting with the ideal slice plane.

The receiving function 123d receives the ideal slice position set by the operator, that is, the position and the inclination of the slice reference shape 201 set on the distortion-corrected image 600 being displayed as the positioning image, via the input interface 124. The receiving function 123d obtains the position and the orientation of the ideal slice plane, based on the position and the inclination of the slice reference shape 201. The position and the orientation of the ideal slice plane are information defining the ideal slice plane. The receiving function 123d sends the received information defining the ideal slice plane to the calculating function 123e.

Furthermore, to explain more in detail, the position of the ideal slice position is also defined by a slice thickness. The slice thickness may be set as an initial setting of an imaging parameter corresponding to a region to be imaged, or may be entered by the operator, for example. The display control function 123c may change the thickness of the slice reference shape 201 that is displayed on the display 125 based on the set slice thickness.

Furthermore, designated in the example illustrated in FIG. 3 is one ideal slice plane, but the method for designating the ideal slice plane is not limited thereto. For example, the ideal slice plane may be set in plurality, in a unit referred to as a slice group including a plurality of slice planes that are arranged in the thickness direction of the slice plane. In such a configuration, the number of slice planes included in one slice group, a gap between the slice planes in the slice group, and the like are also set as the imaging conditions. The slice group is sometimes referred to as a slab or a slice set.

Referring back to FIG. 1, the calculating function 123e calculates the excitation slice plane where the subject P is to be actually excited, based on the designated ideal slice plane, and on the effect of the distortion of the magnetic field. The excitation slice plane is one example of an actual excitation region according to the embodiment. Hereinafter, when an ideal slice plane and an excitation slice plane are to be generally explained without being distinguished from each other, such slice planes will be simply referred to as a slice plane. Furthermore, when the position of an ideal slice plane and that of an excitation slice plane are to be generally explained without being distinguished from each other, such positions will be simply referred to as a slice position.

A difference between the ideal slice plane designated in the distortion-corrected image 600, and the excitation slice plane where the subject P is to be actually excited will now be explained with reference to FIG. 4.

FIG. 4 is a schematic for explaining the difference between the ideal slice plane and the excitation slice plane according to the embodiment. As illustrated in FIG. 4, the ideal slice position is designated in the distortion-corrected image 600, using the slice reference shape 201. In the distortion-corrected image 600, because the effect of the distortion of the magnetic field has been corrected, the ideal slice position is defined by ideal coordinates that are under an assumption that the linearity of the gradient magnetic field is ensured. Therefore, the excitation slice plane to be actually excited becomes different from the ideal slice plane that is based on the ideal slice position designated in the distortion-corrected image 600, by an amount corresponding to the amount by which the magnetic field distortion is corrected.

For example, FIG. 4 illustrates an example in which the position of the slice reference shape 201 in the distortion-corrected image 600 is plotted to the uncorrected magnetic resonance image 500. The slice reference shape 201 in the uncorrected magnetic resonance image 500 is offset to a position not intersecting with the subject P. Furthermore, the slice plane to be actually excited becomes distorted because of the effect of the non-linearity of the gradient magnetic field. An explanatory image 700 in FIG. 4 schematically illustrates the actual excitation slice plane. In the explanatory image 700, a shape 202 represents the range covered by the excitation slice plane. For example, in FIG. 4, because the excitation slice plane is located at a position offset from the subject P, it is not possible to capture an image of the subject P. The way in which position to be excited is moved is not limited to that illustrated in FIG. 4. For example, even though the subject P is excited, the excitation may take place at a position offset from the slice position intended by the operator.

To explain more in detail, the calculating function 123e calculates an excitation region where the subject P is to be actually excited, from a relation between the RF frequency and the slice position, based on the magnetic field strength distribution information stored in the memory 122.

Figure 5:
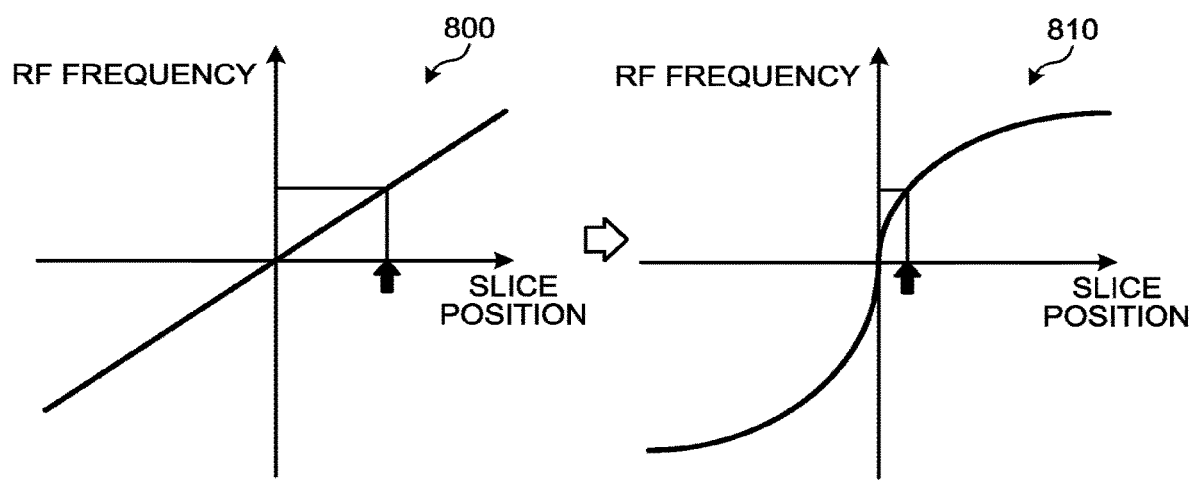
FIG. 5 is a schematic illustrating one example of a relation between an RF frequency and a slice position according to the embodiment.

FIG. 5 is a schematic illustrating one example of the relation between the RF frequency and the slice position according to the embodiment. In FIG. 5, the slice position in one of the X, Y, and Z directions is illustrated, just to simplify the graph. The RF frequency illustrated in FIG. 5 is a resonance frequency at which the slice plane becomes excited. This resonance frequency is determined based on the type of the atomic nuclei, and the strength of the magnetic field. For example, when the target to be excited are protons in hydrogen atoms, by multiplying the gyromagnetic ratio $\gamma=42.6$ MHz/T to the magnetic field strength distribution, the Larmor frequency distribution is obtained. By applying an RF pulse at a resonance frequency within a range that matches a Larmor frequency to the protons in the magnetic field, the protons become excited and the slice plane is selected. At this time, the RF pulse is not a pulse at a single frequency, but has a width of frequencies that are defined by a form and a length, that is, has a frequency range.

A graph 800 indicates one example of a relation between an ideal RF frequency and slice position, under an assumption that the linearity of the gradient magnetic field is ensured. The slice position in the graph 800 represents the ideal slice position designated in the distortion-corrected image 600.

By contrast, a graph 810 indicates one example of the relation between the RF frequency and the slice position, taking the non-linearity of the gradient magnetic field into consideration, based on the magnetic field strength distribution information. When the gradient magnetic field is not linear, the relation between the RF frequency and the slice position changes, as indicated in the graph 810. Therefore, even though the RF frequency remains the same, the slice position is moved. Therefore, a region different from the ideal slice plane becomes excited.

Furthermore, in the reality, the relation between the RF frequency and the slice position changes not in one direction, but in all of the X axis, the Y axis, and the Z axis directions. The calculating function 123e calculates the slice plane taking the non-linearity of the gradient magnetic field into consideration, as an excitation slice plane where the subject P is to be actually excited, based on the relation between the RF frequency and the slice position with the non-linearity of the gradient magnetic field taken into consideration.

The excitation slice plane calculated by the calculating function 123e according to the embodiment is a slice plane calculated by taking the non-linearity of the gradient magnetic field into consideration. The excitation slice plane taking the non-linearity of the gradient magnetic field into consideration is defined by the excitation slice positions in the X axis, the Y axis, and the Z axis, respectively, for example. Furthermore, the orientation of the excitation slice plane is defined by the orientation of the normal vector perpendicularly intersecting with the excitation slice plane. The calculating function 123e sends the information defining the calculated position and orientation of the excitation slice plane to the correcting function 123f.

Referring back to FIG. 1, the correcting function 123f corrects the imaging conditions including the orientation of the excitation slice plane and the frequency of the high-frequency magnetic field to be applied to the subject P, in such a manner that the calculated excitation slice plane becomes closer to the ideal slice plane represented as the first region. Specifically, the correcting function 123f corrects the conditions for imaging the excitation slice plane in such a manner that the difference between the excitation slice plane and the ideal slice plane is minimized. The correction of the imaging conditions performed by the correcting function 123f is one example of an excitation region setting.

Hereinafter, when the corrected and uncorrected excitation slice planes are to be distinguished from each other, the excitation slice plane corrected by the correcting function 123f will be referred to as a corrected excitation slice plane, and the excitation slice plane calculated by the calculating function 123e will be referred to as an uncorrected excitation slice plane. The corrected excitation slice plane is one example of an actual excitation region corresponding to the corrected imaging conditions.

To explain more in detail, the correcting function 123f runs a simulation for changing at least one of the normal vector of the uncorrected excitation slice plane and the value of the RF frequency, and obtains a normal vector and an RF frequency that minimize the difference between the corrected excitation slice plane having been moved due to a changed normal vector or RF frequency, and the ideal slice plane. The correcting function 123f performs the simulation through objective function optimization. The value of the RF frequency is, to explain more in detail, a frequency range of the high-frequency magnetic field applied to the subject P. The frequency range is defined as an imaging condition.

For example, when the correcting function 123f changes at least one of the normal vector of the uncorrected excitation slice plane and the value of the RF frequency, the position and the inclination of the uncorrected excitation slice plane become changed. Specifically, when the normal vector is changed, the slice selection gradient magnetic field changes accordingly, and, as a result, the relation between the X axis, the Y axis, and the Z axis slice positions and the RF frequency also changes. In such a case, the slice position changes although the RF frequency remains unchanged. Furthermore, when the RF frequency is changed, the X axis, the Y axis, and the Z axis slice positions change accordingly, although the normal vector remains unchanged.

Figure 6:
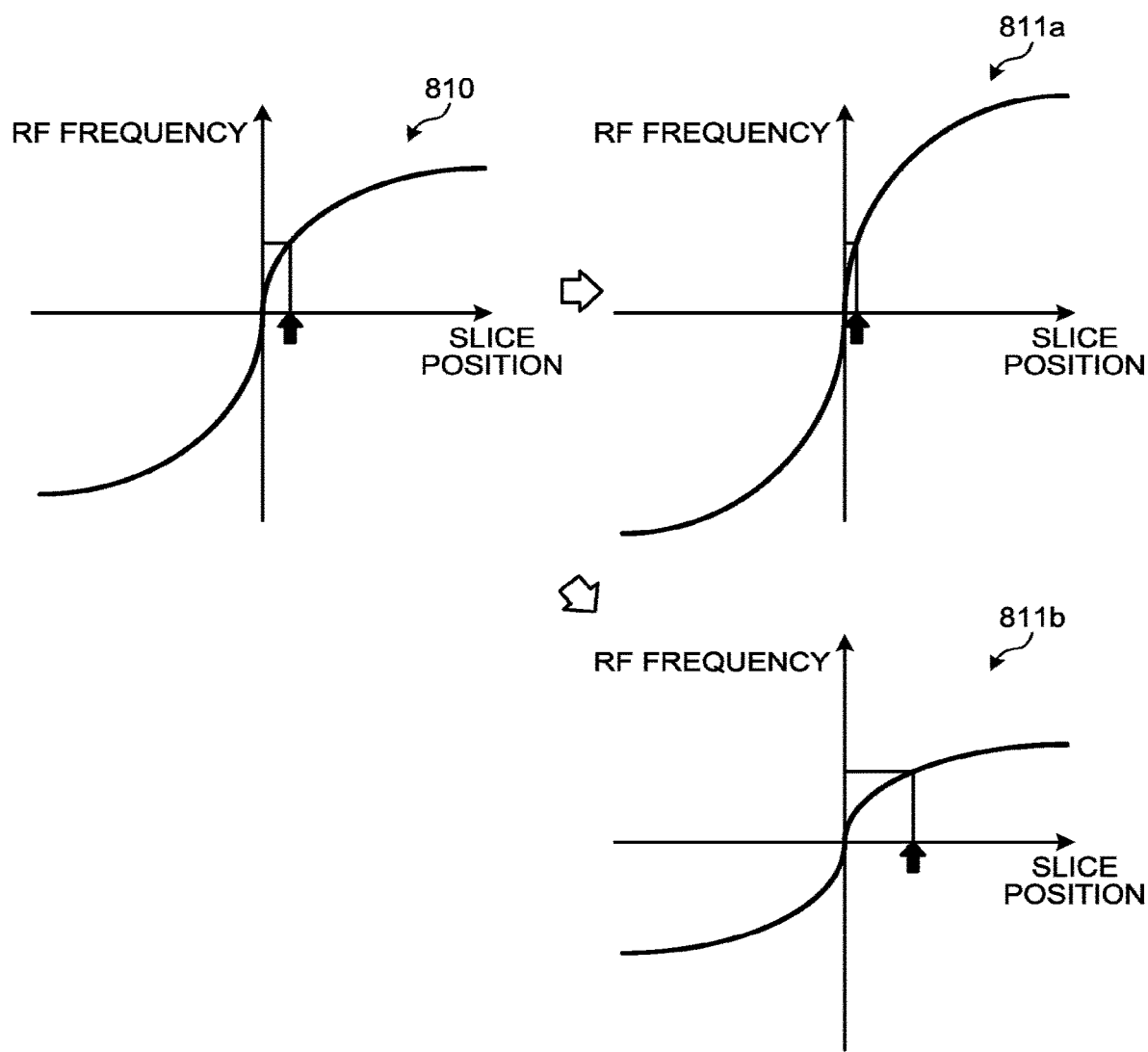
FIG. 6 is a schematic illustrating one example of how the slice position changes in accordance with a change in a normal vector according to the embodiment.

The correction of the excitation slice plane will now be explained further, with reference to FIGS. 6 to 8. FIG. 6 is a schematic illustrating one example of how the slice position changes in accordance with a change in the normal vector according to the embodiment.

The slice position in the graph 810 illustrated in FIG. 6, which is the same as that in FIG. 5, is the uncorrected excited slice position calculated by the calculating function 123e. A graph 811a and a graph 811b in FIG. 6 are examples of the relation between the RF frequency and the slice position resultant of causing the correcting function 123f to change the normal vector.

When the normal vector is changed, the slice selection gradient magnetic field changes accordingly, and, as a result, the relation of the X axis, the Y axis, and the Z axis slice positions with respect to the RF frequency also changes. Therefore, the slice position is moved, as indicated in the graph 811a and the graph 811b, although the RF frequency remains unchanged from that in the graph 810.

Figure 7:
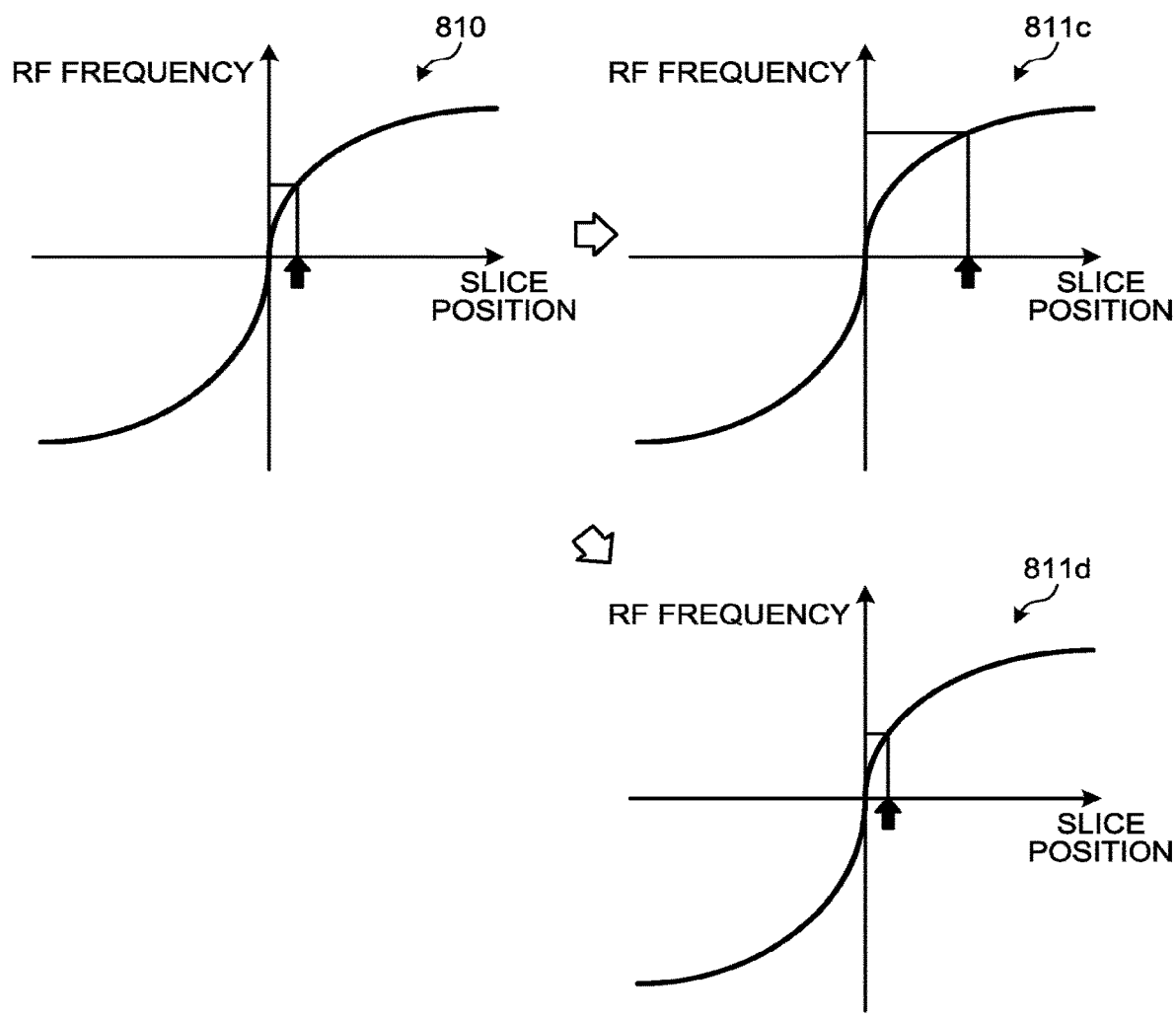
FIG. 7 is a schematic illustrating one example of how the slice position changes in accordance with a change in the RF frequency according to the embodiment.

Furthermore, FIG. 7 is a schematic illustrating one example of how the slice position changes in accordance with a change in the RF frequency according to the embodiment. As illustrated graphs 810, 811c, 811d in FIG. 7, when the RF frequency is changed, the X axis, the Y axis, and the Z axis slice positions also change accordingly.

Figure 8:
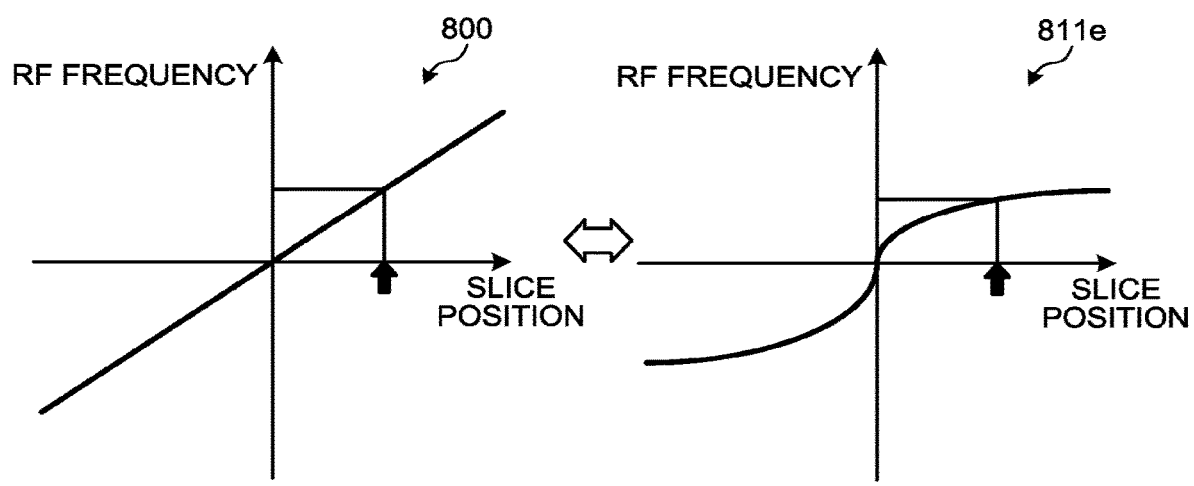
FIG. 8 is a schematic illustrating one example of how the slice position changes in accordance with changes in both of the normal vector and the RF frequency according to the embodiment.

FIG. 8 is a schematic illustrating one example of how the slice position changes in accordance with changes in both of the normal vector and the RF frequency according to the embodiment. Although an example in which one of the normal vector and the RF frequency is changed is illustrated in FIGS. 6 and 7, for the purpose of providing explanations for the normal vector and the RF frequency, respectively, the correcting function 123f changes the excited slice position, considering both of the normal vector and the RF frequency.

For example, in the example illustrated in a graph 811e in FIG. 8, because both of the normal vector and the RF frequency are changed, the corrected excited slice position in one of the axes is located near the ideal slice position, which is illustrated in the graph 800.

In FIGS. 6 to 8, although the slice position in one of the directions is illustrated for the purpose of simplifying the graph, the correcting function 123f corrects the imaging conditions based on the relation between the normal vector and the slice position, in all of the X axis, the Y axis, and the Z axis.

For example, in this embodiment, the correcting function 123f calculates a combination of the orientation of the corrected excitation slice plane and the RF frequency, the combination being one that optimizes an objective function related to the ratio of match between the ideal slice plane and the corrected excitation slice plane, and corrects the imaging conditions that define the excitation slice plane calculated by the calculating function 123e, based on the calculated combination.

The objective function according to the embodiment is an objective function that has, as its variables, values in the X axis, the Y axis, and the Z axis defining the normal vector perpendicularly intersecting with the excitation slice plane, and a value of the RF frequency. The aim of the objective function is to minimize the difference between the ideal slice plane and the corrected excitation slice plane.

An index for indicating the difference between the ideal slice plane and the corrected excitation slice plane is not limited to any particular index, but the correcting function 123f obtains a ratio of match between the corrected excitation slice plane and the ideal slice plane, as an example. In this embodiment, in particular, the ratio of matching volume between the ideal slice plane and the corrected excitation slice plane is used as an index of the difference. The ratio of matching volume is a ratio of the volume of a matching region matching the ideal slice plane, with respect to the entire volume of the corrected excitation slice plane. With such a configuration, by optimizing the objective function, the ratio of matching volume between the ideal slice plane and the corrected excitation slice plane is maximized. For example, the maximization of the objective function can be expressed as argmax f(x, y, z, RF, θ). In this function, RF denotes the RF frequency, and θ denotes a parameter excluded from the optimization, among the parameters required in calculating the ratio of matching volume. For example, θ is a parameter related to a width in the slice plane direction (FOV) and a width in the thickness direction (thickness). The arguments x, y, and z are X, Y, and Z-axis values that define the normal vector perpendicularly intersecting with the excitation slice plane.

The correcting function 123f may use any known method as the optimization method for optimizing the objective function, such as the quasi-Newton method or particle swarm optimization method.

The correcting function 123f transmits the combination of the normal vector and the RF frequency that maximizes the ratio of match between the ideal slice plane and the corrected excitation slice plane, to the collecting function 123a.

The sequence of an image capturing process performed by the MRI apparatus 100 according to the embodiment will now be explained. The image capturing process according to the embodiment includes an excitation region setting process.

Figure 9:
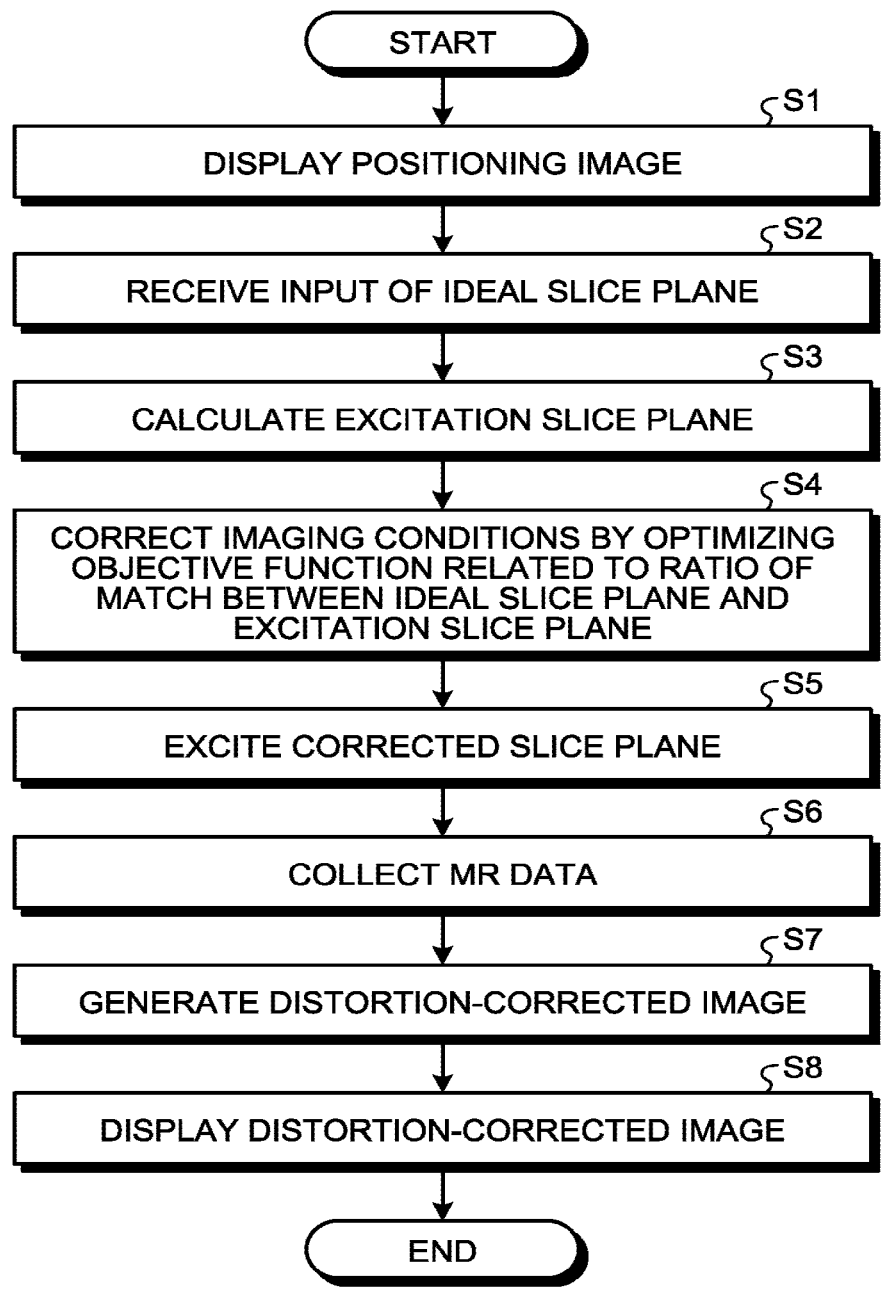
FIG. 9 is a flowchart illustrating one example of the sequence of an image capturing process according to the embodiment.

FIG. 9 is a flowchart illustrating one example of the sequence of the image capturing process according to the embodiment. It is assumed herein that, before the process illustrated in this flowchart is performed, a scan has been performed once or more, and the reconstructing function 123b has generated a distortion-corrected image 600 based on the MR data collected in these scans. The generated distortion-corrected image 600 is stored in the memory 122, for example. The purpose of the scans performed prior to the process illustrated in this flowchart is not limited to the purpose of obtaining a positioning image. In other words, a diagnostic image obtained using another protocol (scan) may be used as the distortion-corrected image 600 used in the process illustrated in this flowchart.

To begin with, the display control function 123c displays the distortion-corrected image 600 on the display 125, as the positioning image for the next image-capturing operation (S1).

Figure 10:
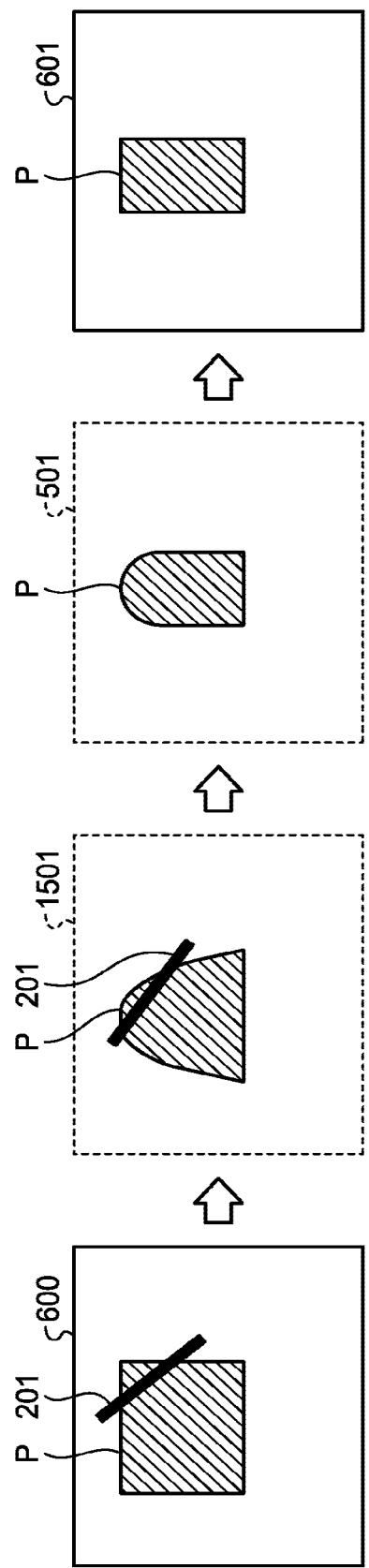
FIG. 10 is a schematic illustrating one example of the sequence of a process related to a correction according to the embodiment.

The sequence of the process will be explained with reference to FIG. 10, as well as the flowchart illustrated in FIG. 9. FIG. 10 is a schematic illustrating one example of the sequence of a process related to a correction according to the embodiment. The display control function 123c displays the distortion-corrected image 600 illustrated on the leftmost side in FIG. 10 on the display 125, as the positioning image. The slice reference shape 201 represents the ideal slice position in the distortion-corrected image 600, which is being displayed as the positioning image.

The receiving function 123d then receives an input of an ideal slice plane designated by the operator in the distortion-corrected image 600 (S2). The receiving function 123d then transmits the position and the orientation of the received ideal slice plane to the calculating function 123e.

The calculating function 123e then calculates an excitation slice plane where the subject P is to be actually excited, from the ideal slice plane designated in the distortion-corrected image 600, based on the magnetic field strength distribution information stored in the memory 122 (S3). This excitation slice plane calculated by the calculating function 123e is the uncorrected excitation slice plane.

The correcting function 123f then corrects the imaging conditions that define the excitation slice plane, by optimizing the objective function related to the ratio of match between the ideal slice plane and the excitation slice plane (S4). Specifically, the correcting function 123f obtains the normal vector and the RF frequency that maximize the ratio of matching volume between the ideal slice plane and the corrected excitation slice plane. The normal vector is represented by an X-axis value, a Y-axis value, and a Z axis value.

For example, for the purpose of explaining the concept of the correction, the slice reference shape 201 is plotted to the uncorrected magnetic resonance image 500, in an explanatory image 1501 illustrated in FIG. 10. As illustrated in the explanatory image 1501, because the slice plane is corrected to the position and the angle taking the distortion of the gradient magnetic field into consideration, a position closer to the ideal slice plane becomes excited. In reality, the excitation slice plane becomes curved due to the effect of the distortion of the gradient magnetic field, as indicated by the shape 202 representing the range covered by the excitation slice plane in FIG. 4.

The correcting function 123f transmits the combination of the normal vector and the RF frequency that maximize the ratio of match between the ideal slice plane and the corrected excitation slice plane, to the collecting function 123a.

The collecting function 123a then applies a high-frequency magnetic field at the RF frequency corrected by the correcting function 123f, to the corrected excitation slice plane corrected by the correcting function 123f (S5). To explain more in detail, the collecting function 123a sets the corrected normal vector and RF frequency as the pulse sequence, and executes the pulse sequence. By executing the pulse sequence, the sequence control circuitry 110 controls the gradient magnetic field power source 103, the transmission circuitry 107, and the reception circuitry 109.

The collecting function 123a then collects the MR data based on the MR signals resultant of the execution of the pulse sequence (S6). This MR data is generated as a result of exciting the corrected excitation slice plane in the subject P.

Because this MR data has been affected by the distortion of the gradient magnetic field, if the MR data is rendered without applying any distortion correction, the shape of the subject P will be rendered as distorted in the off-center region, as indicated in un uncorrected magnetic resonance image 501 in FIG. 10, for example.

To address this issue, the reconstructing function 123b generates a distortion-corrected image 601 by correcting the distortion caused by the distortion of the gradient magnetic field, in the uncorrected magnetic resonance image 500, based on the gradient magnetic field distortion information stored in the memory 122, for example (S7). The reconstructing function 123b then stores the generated distortion-corrected image 601 in the memory 122.

The display control function 123c then displays the distortion-corrected image 601 on the display 125 (S8). The process illustrated in the flowchart is then ended. When the image capturing is to be continued, the display control function 123c may display the distortion-corrected image 601 on the display 125, as the positioning image for the next image-capturing operation, and the processes at S1 to S8 may be repeated.

In the manner described above, in the excitation region setting method performed by the MRI apparatus 100 according to the embodiment, the actual excitation region where the subject P is to be actually excited is calculated based on the first region designated by the operator in the distortion-corrected image 600, and on the effect of the distortion of the magnetic field. Furthermore, in the setting method, the imaging conditions including at least one of the orientation of the slice plane that defines the actual excitation region or the frequency of the high-frequency magnetic field applied to the subject P are corrected in such a manner that the calculated actual excitation region becomes closer to the ideal excitation region represented as the first region. Therefore, with the excitation region setting method according to the embodiment, by calculating the excitation slice plane based on the effect of the distortion of the magnetic field, and correcting the imaging conditions that define the excitation slice plane, it is possible to improve the ratio of match between the ideal slice plane represented as an operator-designated region in the distortion-corrected image 600, and the excitation slice plane that is the actual excitation region.

For example, because the effect of the distortion of the magnetic field has been corrected in the distortion-corrected image 600, the excitation slice plane to be actually excited becomes different from the ideal slice plane that is based on the ideal slice position designated in the distortion-corrected image 600, by an amount corresponding to the amount by which the magnetic field distortion is corrected. Therefore, although the subject P is excited based on the ideal slice plane designated in the distortion-corrected image 600, the operator sometimes fails to capture a magnetic resonance image as intended by the operator. For example, when an image of a spine (a thoracolumbar spine or the entire spinal cord), or a joint in a shoulder, a knee, or a leg is to be captured, often captured is an image of the off-center region. Conventionally, when an image of the off-center region is to be captured, the region actually excited is often different from the ideal slice plane due to the effect of the distortion of the gradient magnetic field.

Available as a technology for addressing such an issue is a technology for moving the ideal slice position designated by the operator in the distortion-corrected image, in a parallel direction, and capturing an image of the cross section at the resultant position. However, because the distortion of the gradient magnetic field is non-linear, the shape of the actual excitation slice plane becomes curved and tilted. Therefore, it has been difficult to correct the slice plane actually to be excited in a manner taking the curve or the tilt into consideration, merely by moving the ideal slice position in parallel. By contrast, with the excitation region setting method according to the embodiment, because corrected are the imaging conditions including at least one of the orientation of the slice plane that defines the actual excitation region, or the frequency of the high-frequency magnetic field applied to the subject P, it is possible to make a correction considering the curve and the tilt, as well as the position of the slice plane.

Furthermore, as another comparative example, there is a technology that uses an uncorrected magnetic resonance image, in which the effect of the distortion of the magnetic field has not been corrected, as the positioning image. With this technology, because the effect of the distortion of the magnetic field is not corrected in the positioning image, the slice plane to be actually excited does not become offset from the slice plane designated in the positioning image by the operator.

However, generally speaking, distortion-corrected images are used when doctors or the like make diagnoses. Therefore, with such a technology, it is necessary to reconstruct and to store an uncorrected magnetic resonance image, separately from the distortion-corrected image for making a diagnosis. Furthermore, when an uncorrected magnetic resonance image is displayed separately from the distortion-corrected image for making a diagnosis, there is a possibility of confusing the user. By contrast, with the excitation region setting method according to the embodiment, because it is possible to use a distortion-corrected image 600 as the positioning image, by correcting the imaging conditions that define the excitation slice plane, it is not necessary to reconstruct a separate uncorrected magnetic resonance image. Furthermore, with the excitation region setting method according to the embodiment, because the diagnostic image and the positioning image are both distortion-corrected images 600, the user does not need to refer to a plurality of types of images.

Furthermore, in the excitation region setting method according to the embodiment, the MRI apparatus 100 obtains a ratio of match between the actual excitation region corresponding to the corrected imaging conditions, and the ideal excitation region. Therefore, with the excitation region setting method according to the embodiment, it is possible to identify how different the actual excitation region corresponding to the corrected imaging conditions is, quantitatively, with respect to the ideal excitation region.

Furthermore, in the excitation region setting method according to the embodiment, the orientation of the excitation slice plane is defined by the orientation of the normal vector intersecting perpendicularly to the slice plane to be excited. With the excitation region setting method according to the embodiment, because the MRI apparatus 100 corrects the imaging conditions including at least one of the orientation of the slice plane that defines the actual excitation region or the frequency of the high-frequency magnetic field applied to the subject P, it is possible to move the excitation slice plane closer to the ideal slice plane, by changing not only the position of the excitation slice plane but also the angle of the inclination.

Furthermore, in the excitation region setting method according to the embodiment, the MRI apparatus 100 corrects the imaging conditions in such a manner that the difference between the excitation slice plane and the ideal slice plane is minimized. Therefore, with the excitation region setting method according to the embodiment, it is possible to move the excitation slice plane closer to the ideal slice plane highly precisely.

Furthermore, in the excitation region setting method according to the embodiment, the MRI apparatus 100 corrects the imaging conditions based on the combination of the orientation of the excitation slice plane and the high-frequency magnetic field that optimize the objective function related to the ratio of match between the ideal slice plane and the excitation slice plane. Therefore, with the excitation region setting method according to the embodiment, it is possible to obtain the excitation slice plane closest to the ideal slice plane, by running a simulation of an inclination and a position of the excitation slice plane.

Furthermore, in the excitation region setting method according to the embodiment, the MRI apparatus 100 changes the frequency range of the high-frequency magnetic field when the excitation slice plane is to be corrected. In this manner, with the excitation region setting method according to the embodiment, it is possible to change the position of the excitation slice plane to be selected.

Furthermore, in the excitation region setting method according to the embodiment, the MRI apparatus 100 calculates the excitation slice plane and corrects the imaging conditions based on the effect of the distortion of the gradient magnetic field. Therefore, with the excitation region setting method according to the embodiment, it is possible to reduce the amount by which the excitation slice plane becomes offset from the ideal slice plane, due to the non-linearity of the gradient magnetic field.

Furthermore, in the excitation region setting method according to the embodiment, the MRI apparatus 100 collects MR data by applying a high-frequency magnetic field at the RF frequency resultant of the correcting process, to the corrected excitation slice plane. Furthermore, the corrected excitation slice plane is the region where the image is captured, that is, the imaging region. Therefore, with the excitation region setting method according to the embodiment, it is possible to achieve a corrected excitation slice plane exhibiting a high ratio of match with the ideal slice plane.

In this embodiment, the reconstructing function 123b is explained to generate only the distortion-corrected image 600, but the reconstructing function 123b may also be configured to generate both of the uncorrected magnetic resonance image 500 and the distortion-corrected image 600. With such a configuration, the reconstructing function 123b may generate the uncorrected magnetic resonance image 500, and then generate a distortion-corrected image 600 from the uncorrected magnetic resonance image 500 by correcting the effect of the distortion of the magnetic field in the uncorrected magnetic resonance image 500.

In the objective function according to the embodiment, the ratio of matching volume represents a ratio of the volume of a matching region matching the ideal slice plane, with respect to the entire volume of the corrected excitation slice plane. However, instead of the volume of the entire corrected excitation slice plane, it is also possible to use the volume of a partial region of the corrected excitation slice plane, as a reference in evaluating the ratio of matching volume. Furthermore, the ratio of matching volume may also represent a ratio of the volume of a matching region that matches the corrected excitation slice plane, with respect to the volume of the entire or a part of the ideal slice plane.

In this embodiment, the processing circuitry 123 in the MRI apparatus 100 is explained to execute the excitation region setting method, but it is also possible to configure an information processing apparatus, such as a personal computer (PC) or a server, installed external of the MRI apparatus 100 to execute the excitation region setting.

First Modification

In the embodiment described above, the excitation slice plane is calculated and corrected based on the effect of the distortion of the gradient magnetic field. However, the distortion of the magnetic field to be corrected is not limited to that of the gradient magnetic field. For example, the MRI apparatus 100 may calculate and correct the excitation slice plane based not only on the effect of the distortion of the gradient magnetic field, but also based on the effect of that of the static magnetic field.

For example, the memory 122 may also store therein not only the gradient magnetic field distortion information but also static magnetic field distortion information representing the values of the distortion of the static magnetic field in the MRI apparatus 100. The static magnetic field distortion information is information indicating a ratio at which the static magnetic field becomes distorted from the ideal shape, with respect to a distance from the center of the static magnetic field, for example. Furthermore, because the magnetic field strength distribution (field map) is a distribution of the magnetic field generated as a result of superimposing the gradient magnetic field onto the static magnetic field, as explained earlier, when such a configuration is to be used, the magnetic field strength distribution is generated based on both of the distortion of the static magnetic field and that of the gradient magnetic field.

Furthermore, the MRI apparatus 100 may be provided with a configuration for calculating and correcting the excitation slice plane only taking the effect of the distortion of the static magnetic field into consideration, without taking the effect of the distortion of the gradient magnetic field into consideration.

Second Modification

Furthermore, in the embodiment described above, the correcting function 123f is explained to correct the excitation slice plane using an objective function that maximizes the ratio of matching volume between the ideal slice plane and the excitation slice plane, but the objective function is not limited thereto.

For example, when a plurality of ideal slice planes are specified as a slice group, the correcting function 123f may correct excitation slice planes using an objective function that maximizes the ratio of match between each of the ideal slice planes included in the slice group, and corresponding one of the excitation slice planes.

Figure 11:
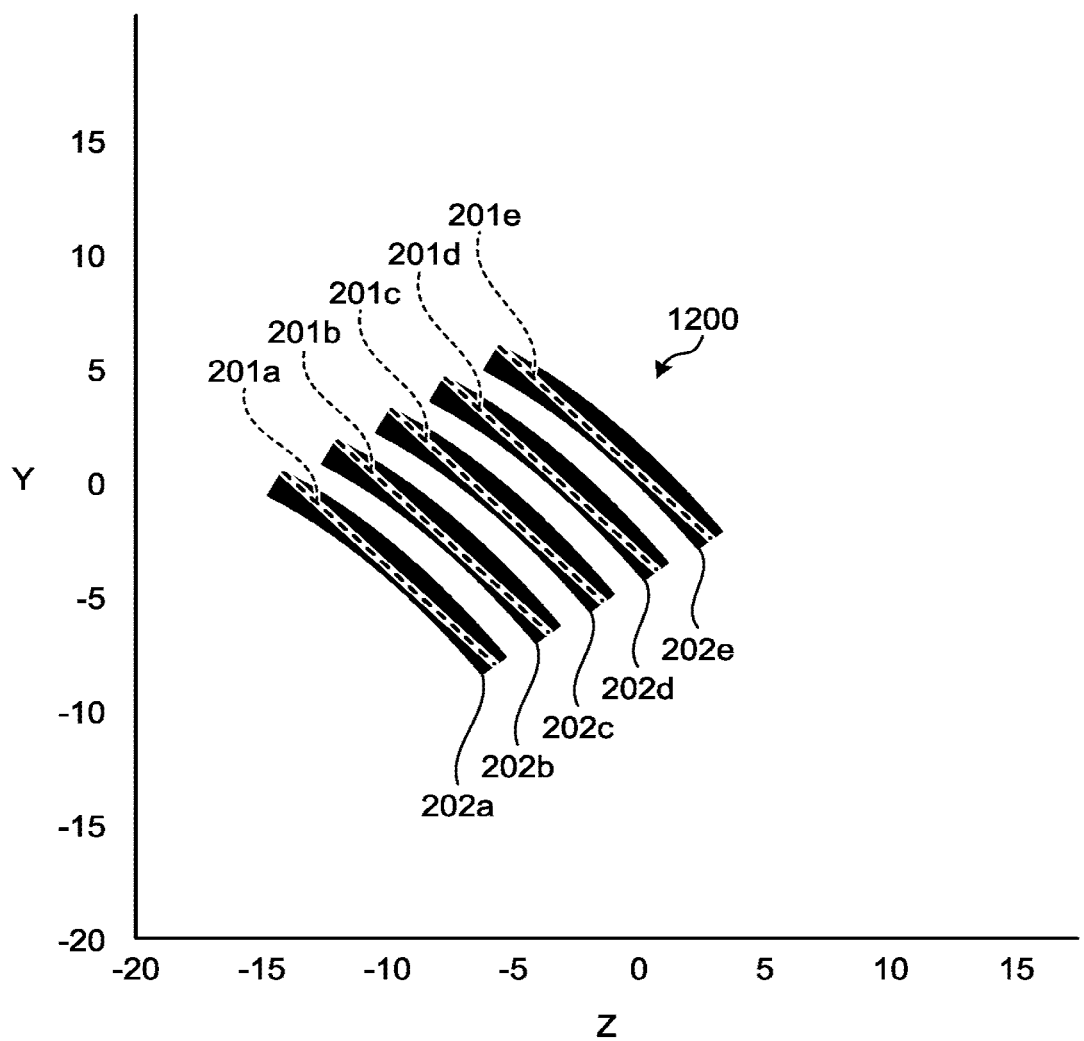
FIG. 11 is a schematic illustrating one example of a plurality of ideal slice planes and a plurality of excitation slice planes, in a slice group according to a second modification.

FIG. 11 is a schematic illustrating one example of a plurality of ideal slice planes 201a to 201e and a plurality of excitation slice planes 202a to 202e included in a slice group 1200 according to this modification. As illustrated in FIG. 11, the ideal slice planes 201a to 201e are in one-to-one corresponding relations with the excitation slice planes 202a to 202e, respectively. For example, the ratio by which the ideal slice plane 201a overlaps with the excitation slice plane 202a that corresponds to the ideal slice plane 201a is used as the ratio of match between the ideal slice plane 201a and the excitation slice plane 202a.

The correcting function 123f according to this modification obtains the orientations of the excitation slice planes 202a to 202e (that is, the normal vectors of the excitation slice planes 202a to 202e) and RF frequencies for exciting the respective excitation slice planes 202a to 202e, using an objective function that maximizes the ratio of match between the ideal slice planes 201a to 201e, and the excitation slice planes 202a to 202e corresponding to the ideal slice planes 201a to 201e, respectively. Although the ideal slice planes 201a to 201e and the ideal slice planes 201a to 201e are plotted two dimensionally, to the Y axis and the Z axis in FIG. 11, the correcting function 123f obtains the normal vectors for the X axis, the Y axis, and the Z axis, respectively, in the same manner as in the embodiment described above.

Furthermore, the correcting function 123f may also be configured to correct the excitation slice planes using an objective function that maximizes the ratio of match between some of the ideal slice planes and corresponding some of the excitation slice planes, instead of the ratio of match between all of the ideal slice planes included in the slice group 1200 and the excitation slice planes. For example, the correcting function 123f may be configured to make an evaluation of the ratio of match only between the ideal slice planes and the excitation slice plane near the center of the magnetic field.

Third Modification

As another example of the objective function, it is also possible to use an objective function that maximizes the ratio of matching volume between the ideal slice plane and the excitation slice plane, by giving weights to the volumes of the regions of the ideal slice plane and the excitation slice plane, and using the weighted sums of the volumes. For example, it is possible to use an objective function in which a weighting factor for a region nearer the center of the magnetic field, i.e., a region of interest is higher than a weighting factor for any other region in calculating the ratio of matching volume between the ideal slice plane and excitation slice plane.

Furthermore, it is also possible to use an objective function that maximizes the ratio of match between a plurality of ideal slice planes included in a slice group, and a plurality of excitation slice planes, by giving weights to the volumes of the regions of the ideal slice planes and the excitation slice planes, and using the weighted sums of the volumes. For example, it is possible to use an objective function in which a higher weighting factor is used for a region nearer the center of the magnetic field, which is the region of interest, among the regions included in the ideal slice planes and excitation slice planes.

The objective functions according to the embodiment, and to the second and the third modifications are merely exemplary, and the objective function is not limited thereto. For example, the objective function may be a function representing the size of a difference between the ideal slice plane and the excitation slice plane. In such a case, the correcting function 123f corrects the imaging conditions that define the excitation slice plane, by minimizing the objective function.

Fourth Modification

Furthermore, in the embodiment described above, the excitation region correction is applied to the excitation slice plane that is the imaging region, but the correction is not limited to thereto.

For example, a fat-suppressed region may be one example of the excitation region. Furthermore, in such a case, an ideal fat-suppressed region designated by the operator in the distortion-corrected image 600 will be one example of the first region.

In this modification, the calculating function 123e calculates a fat-suppressed region where the subject P is actually excited, from the ideal fat-suppressed region designated in the distortion-corrected image 600, based on the effect of the distortion of the magnetic field. Furthermore, in this modification, the correcting function 123f corrects the imaging conditions that define the fat-suppressed region in such a manner that the difference between the ideal fat-suppressed region and the fat-suppressed region to be actually excited is minimized, by changing at least one of the normal vector of the fat-suppressed region and the high-frequency magnetic field applied to the subject P. For example, the correcting function 123f may also be configured to correct the fat-suppressed region based on an objective function that maximizes the ratio of matching volume between the ideal fat-suppressed region and the fat-suppressed region to be actually excited.

Furthermore, in this modification, the high-frequency magnetic field applied to the subject P includes a saturation pulse that suppresses the MR signals emitted from other types of tissues, without limitation to those from the fat. As one example, the high-frequency magnetic field applied to the subject P according to this modification is a saturation (SAT) pulse.

With the excitation region setting method performed in the MRI apparatus 100 according to this modification, it is possible to improve the ratio of match between the ideal fat-suppressed region and the fat-suppressed region to be actually excited. Therefore, with the excitation region setting method according to this modification, it is possible to capture a fat-suppressed image with the fat suppression applied to a position desired by the operator.

Fifth Modification

Furthermore, it is also possible to use a region to which an inversion recovery (IR) pulse is applied in non-contrast magnetic resonance angiography (MRA), as one example of the excitation region. In such a case, an ideal region to which the IR-pulse is to be applied, designated by the operator in the distortion-corrected image 600, is one example of the first region.

For example, the IR-pulse applied region is a region upstream of a blood stream with respect to the imaging region, in the subject P. The IR-pulse applied region is not limited thereto.

Furthermore, the IR pulse may be a pulse applied to reduce the MR signals emitted from blood incoming from the periphery of the imaging region, or a pulse applied to enhance the MR signals in the imaging region.

With the excitation region setting method performed in the MRI apparatus 100 according to this modification, it is possible to improve the ratio of match between the ideal IR-pulse applied region designated by the operator in the distortion-corrected image 600, and the excitation region to be actually excited by the IR pulse.

The excitation regions to be corrected described in the fourth and fifth modifications are merely exemplary, and the excitation region to be corrected may be the regions to which various types of pre-pulses are to be applied.

According to at least one of the embodiments explained above, it is possible to improve the ratio of match between the region set by the operator in the distortion-corrected image, and the actual excitation region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An excitation region setting method, comprising:
receiving a designation of a first region from a user, the first region being designated in a distortion-corrected image that is a magnetic resonance image in which an effect of a distortion of a magnetic field has been corrected;
calculating an actual excitation region where a subject is to be excited, based on the designated first region and the effect of the distortion of the magnetic field; and
correcting imaging conditions including (i) an orientation of a slice plane that defines the actual excitation region, and (ii) a frequency of a high-frequency magnetic field applied to the subject based on a combination of the orientation of the slice plane and the frequency of the high-frequency magnetic field, the combination being one that optimizes an objective function related to a matching ratio between the actual excitation region and an ideal excitation region represented by the first region; and executing a pulse sequence based on the corrected imaging conditions, and reconstructing an image after executing the pulse sequence.

2. The excitation region setting method according to claim 1, wherein the correcting step further comprises obtaining the matching ratio between an actual excitation region corresponding to the corrected imaging conditions, and the ideal excitation region.

3. The excitation region setting method according to claim 1, wherein the orientation of the slice plane is an orientation of a normal vector intersecting perpendicularly to the slice plane.

4. The excitation region setting method according to claim 1, wherein the correcting step further comprises correcting the imaging conditions in such a manner that a difference between the actual excitation region and the ideal excitation region is minimized.

5. The excitation region setting method according to claim 1, wherein
the imaging conditions include a frequency range of the high-frequency magnetic field, and
the correcting step further includes changing the frequency range of the high-frequency magnetic field.

6. The excitation region setting method according to claim 1, wherein the distortion of the magnetic field is a distortion of a gradient magnetic field.

7. The excitation region setting method according to claim 1, wherein the distortion of the magnetic field is a distortion of a static magnetic field.

8. The excitation region setting method according to claim 1, wherein
the reconstructing step further comprises applying the high-frequency magnetic field of the frequency obtained in the correcting step to an actual excitation region that is defined by the imaging conditions corrected in the correcting step.

9. The excitation region setting method according to claim 8, wherein
the actual excitation region that is defined by the imaging conditions is an imaging region, and
the reconstructing step further comprises collecting a magnetic resonance signal generated as a result of applying the high-frequency magnetic field to the imaging region in the applying step.

10. The excitation region setting method according to claim 8, wherein the actual excitation region that is defined by the imaging conditions is a fat-suppressed region.

11. The excitation region setting method according to claim 8, wherein the high-frequency magnetic field is an inversion recovery (IR) pulse.

12. A magnetic resonance imaging apparatus, comprising:
processing circuitry configured to
receive a designation of a first region from a user, the first region being designated in a distortion-corrected image that is a magnetic resonance image in which an effect of a distortion of a magnetic field has been corrected;
calculate an actual excitation region where a subject is to be excited, based on the designated first region and the effect of the distortion of the magnetic field; and
correct imaging conditions including (i) an orientation of a slice plane that defines the actual excitation region, and (ii) a frequency of a high-frequency magnetic field applied to the subject based on a combination of the orientation of the slice plane and the frequency of the high-frequency magnetic field, the combination being one that optimizes an objective function related to a matching ratio between the actual excitation region and an ideal excitation region represented by the first region; and
execute a pulse sequence based on the corrected imaging conditions and reconstruct an image after executing the pulse sequence.

* * * * *